(12) United States Patent
Blick et al.

(10) Patent No.: US 8,217,495 B2
(45) Date of Patent: Jul. 10, 2012

(54) HIGH-FREQUENCY BRIDGE SUSPENDED DIODE

(75) Inventors: Robert H. Blick, Madison, WI (US); Chulki Kim, Madison, WI (US); Jonghoo Park, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 272 days.

(21) Appl. No.: 12/721,624

(22) Filed: Mar. 11, 2010

(65) Prior Publication Data

US 2011/0220959 A1   Sep. 15, 2011

(51) Int. Cl.
*H01L 29/88* (2006.01)
*H01L 21/329* (2006.01)
(52) U.S. Cl. ........... 257/594; 257/623; 257/E21.353; 257/E29.339; 438/380; 438/695; 438/739

(58) Field of Classification Search ........... 257/E29.339, 257/E39.34, E29.341
See application file for complete search history.

(56) References Cited

U.S. PATENT DOCUMENTS

| | | | |
|---|---|---|---|
| 4,692,997 A * | 9/1987 | Calviello | 29/25.02 |
| 7,595,500 B2 | 9/2009 | Moddel et al. | |
| 2008/0290781 A1* | 11/2008 | Mikami et al. | 313/495 |
| 2009/0026579 A1* | 1/2009 | Silver et al. | 257/603 |
| 2009/0308443 A1 | 12/2009 | Cutler | |

\* cited by examiner

*Primary Examiner* — Stephen W Smoot
(74) *Attorney, Agent, or Firm* — Boyle Fredrickson, S.C.

(57) ABSTRACT

A high-frequency metal-insulator-metal (MIM) type diode is constructed as a bridge suspended above a substrate to significantly reduce parasitic capacitances affecting the operation frequency of the diode thereby permitting improved high-frequency rectification, demodulation, or the like.

13 Claims, 3 Drawing Sheets

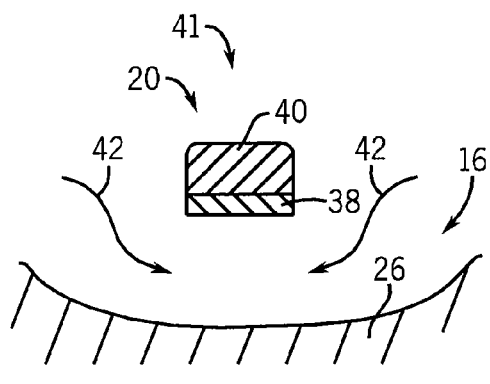
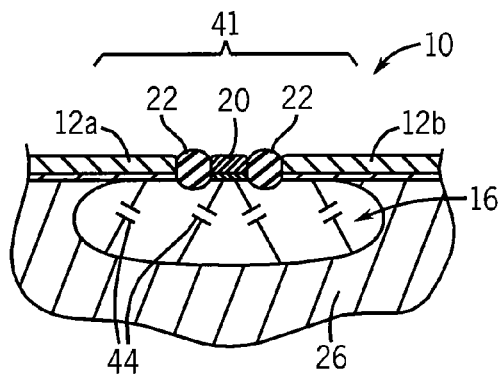
FIG. 3　　　　　　FIG. 4
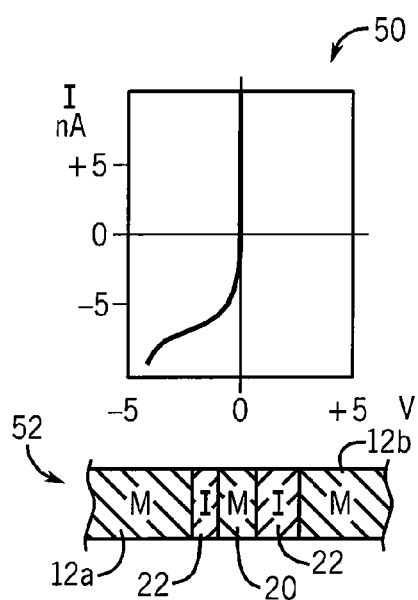
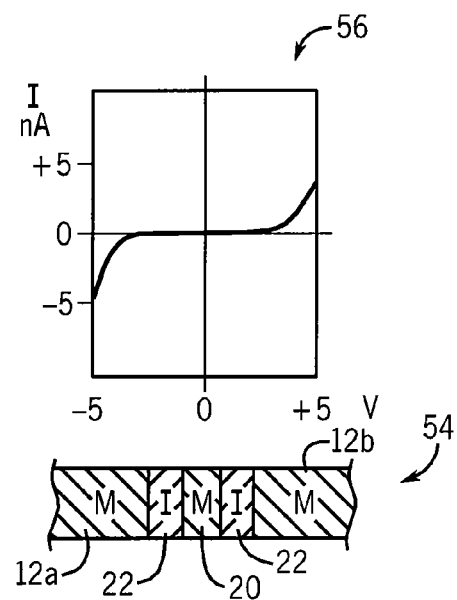
FIG. 5　　　　　　FIG. 6

HIGH-FREQUENCY BRIDGE SUSPENDED DIODE

This invention was made with United States government support awarded by the following agencies:
NAVY N66001-07-1-2046
USAF/AFOSR FA955-08-0337
The United States government has certain rights in this invention.

BACKGROUND OF THE INVENTION

The present invention relates to electrical diodes and in particular to high-speed tunnel diodes having low capacitance.

Diodes are two-terminal electrical devices that block electrical current in one direction and allow it to flow in the opposite direction. This rectification property is often used in electrical circuits to extract a direct current from an alternating current source either for power generation or demodulation.

Typical solid-state diodes (to be distinguished from vacuum tube diodes, for example) employ a junction of different materials that provides a nonlinear and asymmetric IV-curve (current plotted as a function of voltage) across the diode. Common pn-diodes employ a junction between specially doped semiconductors and provide a forward voltage drop, in the conducting direction, of between 0.7-1.7 V. Schottky diodes provide a lower forward voltage drop of approximately 0.15-0.45 V using a junction between a metal and a doped semiconductor. Metal-insulator-metal (MIM) tunnel diodes, in contrast, provide two metal terminals separated by an insulating layer, the latter is traversed by electrons through quantum tunneling. MIM diodes potentially can operate in the terahertz region because of the higher speed of tunneling in contrast to carrier transport through a depletion region in normal junction diodes.

In part because of their high operating frequency, MIM diodes are potential candidates for rectennas, that is, antennas that provide for power rectification as the receiving device for wireless transmission of power through microwave transmission. MIM diodes have also been considered for use with so-called "nantennas" which are intended to employ similar principles to that of the rectenna for the conversion of light to electrical energy.

SUMMARY OF INVENTION

The present invention provides a novel MIM-type diode design having extremely low parasitic capacitance to potentially provide high frequency operation necessary for rectenna, nantenna and other applications.

Generally, the invention employs a three-dimensional fabrication technique in which the diode junction is suspended in a bridge-type structure over the substrate, removing it from the substrate and thus possible capacitive coupling with the substrate elements. By reducing capacitive coupling, improved junction speed can be obtained.

Specifically, the present invention provides an electrical solid-state diode having a substrate supporting on a surface a first and second electrical conductor having corresponding first and second ends approaching each other across a gap, with an insulating material positioned within the gap to permit electron tunneling between the first and second conductors through the insulating material for at least some voltages less than 5 V applied to the first and second electrical conductors. An undercut is positioned beneath the insulating material and the first and second ends separating the insulating material and the first and second ends from the substrate.

It is thus a feature of at least one embodiment of the invention to adopt a suspended diode topology to reduce parasitic capacitances.

The first and second electrical ends may be metals.

It is thus a feature of at least one embodiment of the invention to provide an improved method of fabricating MIM-type diodes.

The gap may further include at least one conductive island and the insulating material may be positioned to separate the conductive island from both the first and second ends to permit electron tunneling between the first conductor and the island through a first portion of the insulating material and between the second conductor and the island through a second portion of the insulating material for at least some voltages less than 5 V applied to the first and second electrical conductors.

It is thus a feature of at least one embodiment of the invention to permit the fabrication of more complex tunneling structures that can introduce asymmetry geometrically.

The gap may further include at least two conductive islands and the insulating material may be positioned to separate the conductive island from both the first and second ends and from each other to permit electron tunneling between the first conductor and the first island through the first portion of the insulating material and between the first island and the second island through a third portion of the insulating material and between the second island and the second conductor through the second portion of the insulating material for at least some voltages less than 5 V applied to the first and second electrical conductors.

It is thus a feature of at least one embodiment of the invention to permit the fabrication of more complex tunneling structures including, for example, resonant tunneling diodes having multiple islands.

The distance between the first end and the island may be different from the distance between the second end and the island.

It is thus a feature of at least one embodiment of the invention to provide a simple method of controlling diode asymmetry.

The metals of the first and second electrical ends may have different work functions.

It is thus a feature of at least one embodiment of the invention to provide an alternative or additional method to increase asymmetry useful for rectification.

The insulator may be a halogenated carbon polymer.

It is thus a feature of at least one embodiment of the invention to create the insulator using deposited materials from common etchants used to fabricate the device.

The substrate may be a silicon wafer.

It is thus a feature of at least one embodiment of the invention to provide a diode that can be fabricated using conventional integrated circuit processing techniques and materials.

The first and second ends may taper to become narrower toward the gap.

It is thus a feature of at least one embodiment of the invention to permit connection of the diode to an arbitrarily sized conductor.

These particular features and advantages may apply to only some embodiments falling within the claims and thus do not define the scope of the invention.

BRIEF DESCRIPTION OF THE FIGURES

FIG. 3 is a view similar to that of FIG. 4, showing the final stages in fabrication of the diode of FIG. 1;

FIG. 4 is a cross-sectional view along line 4-4 of FIG. 1 showing the position of insulation between the island of the diode and the location of parasitic capacitances;

FIG. 5 is a room temperature plot of the IV curve of the diode of FIG. 1 above 300° K, the diagram showing the effective width of the insulation and metal zones caused by asymmetrical positioning of the island;

FIG. 6 is a figure similar to that of FIG. 5 showing the IV curve at 77° K;

DETAILED DESCRIPTION OF THE PREFERRED EMBODIMENT

Figure 1:
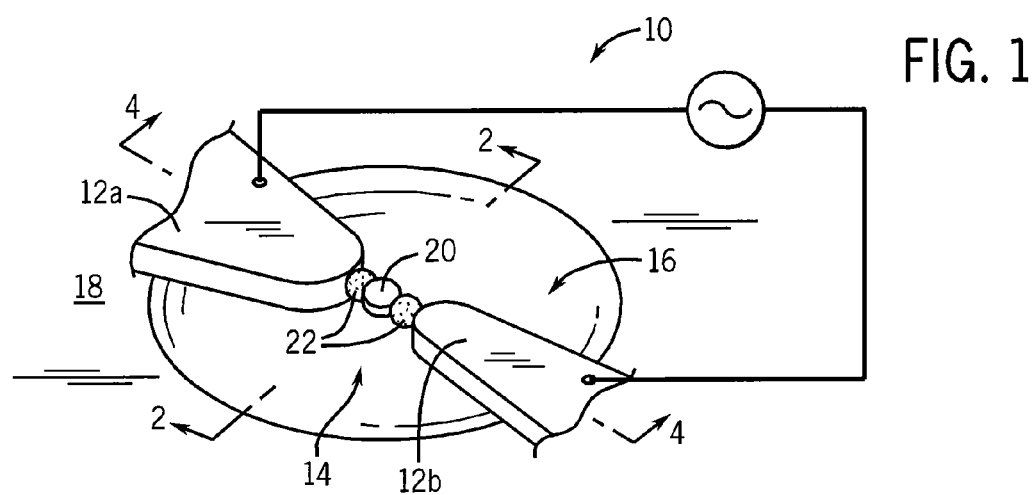
FIG. 1 is a perspective view of the diode structure of the present invention as connected across an alternating current electrical signal for rectification or demodulation, the diode having a conductive island suspended on insulators between terminals.

Referring now to FIG. 1, a diode 10 of the present invention may provide for first and second substantially planar conductor ends 12a and 12b attached to a substrate 18 and opposed across a gap 14 above a cavity 16 in a substrate 18.

Positioned between the first end 12a and second end 12b within the gap 14 is a conductive island 20 suspended between the first end 12a and second end 12b by insulating material 22 on either side of the island 20.

The conductor ends 12a and 12b and island 20 may, for example, be constructed of identical metals such as gold, or metals with different work functions having a few tens of nanometers thickness. The substrate 18 may, for example, be a silicon-on-insulator (SOI) substrate having an exposed upper silicon surface. The gap 14 measured between the conductor ends 12a end 12b may be in one embodiment approximately 150 nm. The insulating material may, for example, be a halogenated carbon polymer, for example, formed mainly of $CF_2$ bonds similar to Teflon.

The structure of the diode 10 thus formed is that of a metal-insulation-metal-insulation-metal junction (MIMIM) being effectively two series connected metal-insulation-metal (MIM) diodes in which current passes from a first terminal of the diode 10 connecting with end 12a and passes through a first insulating material portion 22 to the island 20 and then through a second insulating material portion 22 to a second terminal of the diode 10 formed by end 12b. Passage of electrons through the insulating material portion 22 is by electron tunneling, a mechanism defined by quantum mechanics requiring a narrow gap 14 on the order of the few tens of nanometers for practical current flow at standard voltages.

Figure 2:
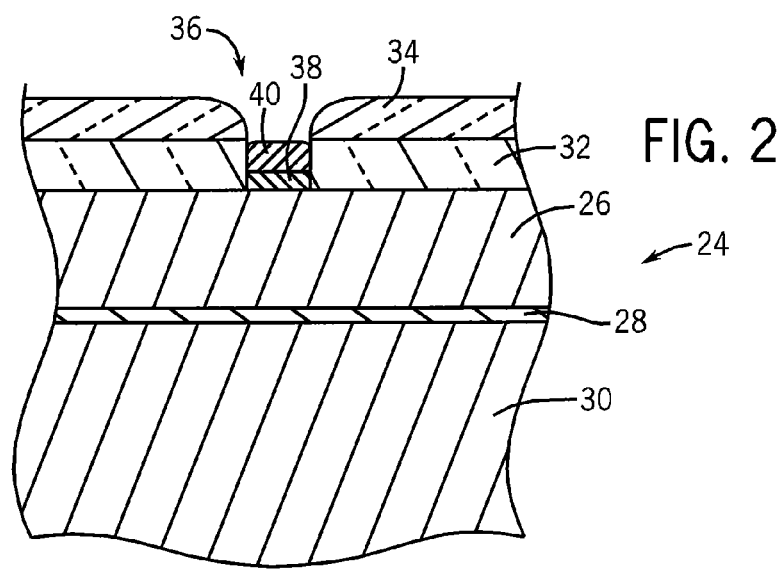
FIG. 2 is a cross-sectional view along line 2-2 of FIG. 1 showing the first stages of fabrication of the diode of FIG. 1.

Referring now to FIG. 2, the diode 10 of the present invention may be fabricated on an SOI substrate 24 having an upper silicon layer 26 separated by a thin oxide layer 28 from a lower silicon layer 30. Such substrates are commercially available from a variety of vendors.

A first layer of photoresist 32 may be spin coated on top of the upper silicon layer 26, for example a poly methyl-methacrylate (PMMA) with a molecular weight of 150 k and with a thickness of approximately 100 nm. On top of this photoresist 32, a second over layer of photoresist 34 may be placed using 500 k PMMA and having a thickness of approximately 100 nm.

Cavities 36 in the photoresist 34 and 32 to the substrate 24 may be formed by electron beam lithography using, for example, an electron beam writer with a 30 kV accelerating potential and a dose of 160 micro-coulombs per square centimeter.

Metallization may then occur in the exposed cavity 36 by thermal process to define an adhesion layer 38 of chromium followed by a 60 nm layer 40 of gold to provide a bridge structure 41 and conductive traces leading up to the bridge structure 41. Removal of the photoresist layers 32 and 34 may then be accomplished with acetone.

Referring now to FIG. 3, the upper silicon layer 26 may then be removed beneath the bridge structure 41, for example, by using a reactive ion etcher and an etchant stream 42 of $CF_4$ to produce cavity 16 beneath the bridge structure 41. For this purpose, the etchant stream 42 may flow at 100 sccm at a chamber pressure of 10 mTorr with an RF power of 100 W. The etch rates of silicon in these conditions is about 25 nm per minute.

Referring now to FIG. 4, during the etching process, the cavity 16 beneath the island 20 and the electrode ends 12a and 12b separates the bridge structure 41 from the upper silicon layer 26 reducing parasitic capacitance 44 between the island 20 and optionally between the ends 12a end 12b and the upper silicon layer 26 providing the substrate 24.

Further, during the etching process, the $CF_4$ gas forms an insulating halogenated Teflon-like polymer mainly composed of $CF_2$ bonds on the surface of the ends 12a and 12b, islands 20, and importantly as the insulating material 22 between the island 20 and each of the ends 12a and 12b. This polymer material provides support of the island 20 in bridge fashion between the ends 12a and 12b before the cavity 16 is formed, completely undercutting these structures, and further provides a coating that passivates the ends 12a, 12b, and island 20.

Referring now to FIG. 5, at room temperature, the diode 10 of FIG. 1 provides an IV curve 50 exhibiting both substantial nonlinearity and asymmetry to provide current conduction in a forward direction and limited current conduction in reverse direction over the range of plus and minus 5 V. The asymmetry, useful for rectification, is believed to be caused by the positional offset of the island 20 between the ends 12a and 12b, having a separation ratio in distance between the end 12a and the island 20, and end 12b and island 20 of about 1:3. This offset produces an effective diode geometry 52 where the electron barrier between island 20 and end 12b dominates electron transport through the diode producing a greater defect density on the left side of the island 20 in comparison to the right side of the island 20.

This asymmetry disappears once the diode 10 is cooled to low temperatures as shown in FIG. 6 producing an effective symmetric diode geometry 54 and symmetric IV curve 56.

Figure 7:
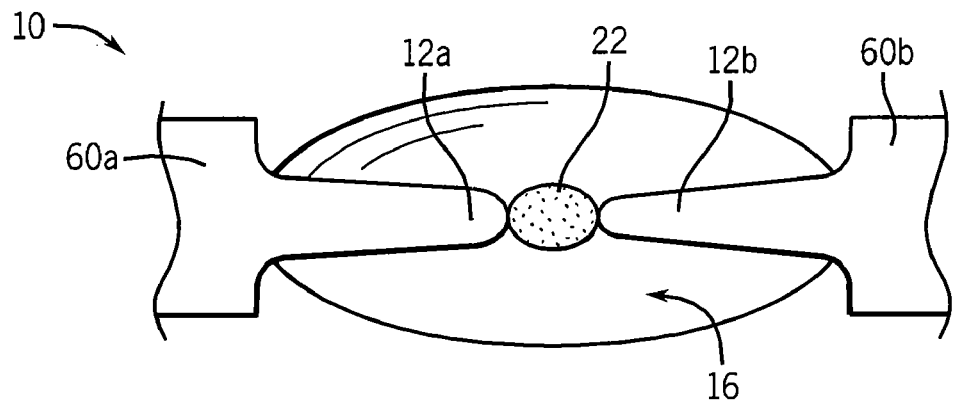
FIG. 7 is a top plan view of an alternative embodiment of the invention eliminating the island.

Referring now to FIG. 7, the present invention raises the possibility of producing a simple MIM diode by placing end 12a closely adjacent to end 12b as separated by insulating material 22 above cavity 16 to provide tunneling directly therebetween. A portion of the ends 12a end 12b and the insulating material 22 may be positioned above cavity 16 to reduce parasitic capacitances.

In all embodiments, the ends 12a and 12b may taper outward away from the insulating material 22 to join with larger conductors 60a and 60b.

Figure 8:
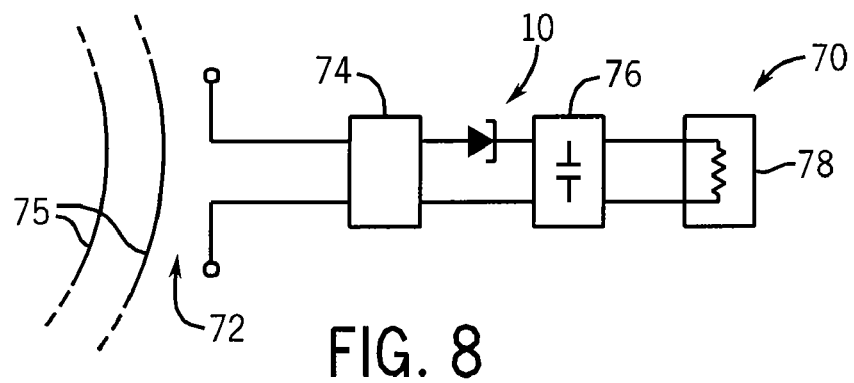
FIG. 8 is a block diagram showing use of the diode in a rectenna or nantenna.

Referring now to FIG. 8, a diode 10 of the present invention may be useful in the construction of a rectenna 70 having an antenna 72 for receiving electromagnetic radiation 75 (e.g. high-frequency microwaves or light). A current signal received by the antenna 72 may be joined by matching network 74, for impedance matching purposes, to a diode 10 per the present invention. A filter 76 may receive rectified electrical signals from the antenna 72 to provide a smooth DC output, which may be applied to a load 78.

Figure 9:
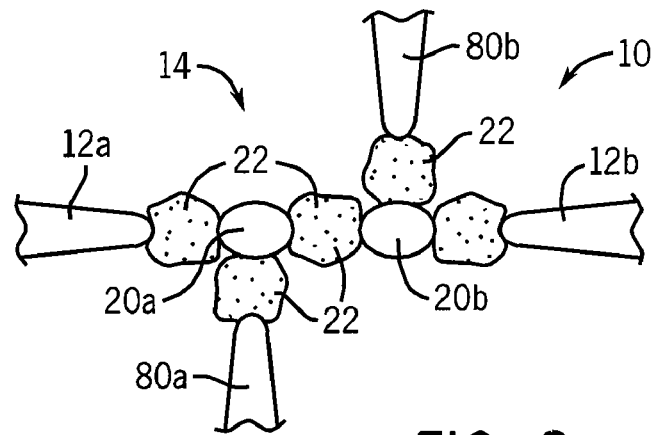
FIG. 9 is a figure of similar to that of FIG. 7 showing a diode having multiple islands and optional gate structures.

Referring now to FIG. 9, in an alternative embodiment, the diode 10 may include multiple islands 20a and 20b in the gap 14 between the ends 12a and 12b so that electrons may pass from ends 12a to island 20a through a first insulating material portion 22 and then from island 20a to 20b through second insulating material portion 22 and then from island 20b to end 12b through a third insulating material portion 22, the insulating material portions 22 permitting tunneling at voltages less than approximately 5 V. These multiple islands 20 may be useful, for example, for constructing resonant tunneling diodes that provide for high degree of frequency transparency at particular frequencies or for higher voltage rectification.

In addition or alternatively, for this embodiment or the embodiment described with respect to FIG. 1, one or more gate electrodes 80a and 80b may be positioned proximate to either or both of islands 20a and 20b as separated by insulating material 22 to provide for electrical biasing of the islands 20 by capacitive coupling or tunneling or the like.

It will be understood that multiple diodes 10 of the present invention can be fabricated repeatedly in multiple locations on a given substrate 24 and connected in series or in parallel to provide for improved voltage breakdown and/or current carrying capacity. Further, the diodes 10 may be constructed both to extend horizontally, parallel to the broad surface of the substrate, but also vertically, in wells in the substrate, for greater density. The terms: "undercutting", "beneath", "above", and the like. should therefore be given an interpretation relative to the diode structure.

It is specifically intended that the present invention not be limited to the embodiments and illustrations contained herein, but include modified forms of those embodiments including portions of the embodiments and combinations of elements of different embodiments as come within the scope of the following claims.

We claim:

1. An electrical solid-state diode comprising:
   a substrate supporting on a surface a first and second electrical conductor having corresponding first and second ends approaching each other across a gap;
   an insulating material positioned within the gap to permit substantial electron tunneling between the first and second conductors through the insulating material for at least some voltages less than 5 V applied to the first and second electrical conductors; and
   wherein an undercut is positioned beneath the insulating material and the first and second ends separating the insulating material and the first and second ends from the substrate.

2. The diode of claim 1 wherein the first and second electrical ends are metals.

3. The diode of claim 2 wherein the metals of the first and second electrical ends have different work functions.

4. The diode of claim 1 wherein the gap further includes at least one conductive island and wherein the insulating material is positioned to separate the conductive island from both the first and second ends to permit substantial electron tunneling between the first conductor and the island through a first portion of the insulating material and between the second conductor and the island through a second portion of the insulating material for at least some voltages less than 5 V applied to the first and second electrical conductors.

5. The diode of claim 4 wherein the gap further includes at least two conductive islands and wherein the insulating material is positioned to separate the conductive island from both the first and second ends and from each other to permit electron tunneling between the first conductor and the first island through the first portion of the insulating material and between the first island and the second island through a third portion of the insulating material and between the second island and the second conductor through the second portion of the insulating material for at least some voltages less than 5 V applied to the first and second electrical conductors.

6. The diode of claim 4 wherein a distance between the first end and the island is different from a distance between the second end and the island.

7. The diode of claim 4 further including a third electrical conductor having a third end proximate to the island and separated therefrom by a portion of the insulating material.

8. The diode of claim 1 wherein the insulating material is a halogenated carbon polymer.

9. The diode of claim 1 wherein the substrate is a silicon wafer.

10. The diode of claim 1 wherein the first and second ends taper to become narrower toward the gap.

11. A method of manufacturing a diode having a substrate supporting on a surface a first and second electrical conductor having corresponding first and second ends approaching each other across a gap and an insulating material positioned within the gap to permit electron tunneling between the first and second conductors through the insulating material for at least some voltages less than 5 V applied to the first and second electrical conductors, wherein an undercut is positioned beneath the insulating material and the first and second ends separating the insulating material and the first and second ends from the substrate, the method comprising the steps of:
   (1) applying the first and second electrical conductors to the substrate; and
   (2) etching the substrate with a selective etchant to undercut the substrate in the vicinity of the first and second ends.

12. The method of claim 11 wherein the selective etchant deposits an insulating material on the first and second ends.

13. The method of claim 11 wherein the etching is a fluorine compound and the insulating material is a fluoropolymer.

* * * * *